(12) United States Patent  
Reitsma

(10) Patent No.: US 8,304,057 B2  
(45) Date of Patent: Nov. 6, 2012

(54) RIBBON CRYSTAL END STRING WITH MULTIPLE INDIVIDUAL STRINGS

(75) Inventor: Scott Reitsma, Shrewsbury, MA (US)

(73) Assignee: Max Era, Inc., Reno, NV (US)

( * ) Notice: Subject to any disclaimer, the term of this patent is extended or adjusted under 35 U.S.C. 154(b) by 820 days.

(21) Appl. No.: 12/252,557

(22) Filed: Oct. 16, 2008

(65) Prior Publication Data

US 2009/0061197 A1 Mar. 5, 2009

Related U.S. Application Data

(63) Continuation-in-part of application No. 12/201,117, filed on Aug. 29, 2008.

(60) Provisional application No. 60/969,263, filed on Aug. 31, 2007.

(51) Int. Cl.  
B32B 3/00 (2006.01)  
B32B 1/00 (2006.01)

(52) U.S. Cl. .......... 428/174; 428/156; 117/922

(58) Field of Classification Search .......... 428/156, 428/174, 357, 364, 375; 117/24, 26, 922, 117/924, 81

See application file for complete search history.

(56) References Cited

U.S. PATENT DOCUMENTS

| | | | |
|---|---|---|---|
| 4,217,165 A | 8/1980 | Ciszek | 156/601 |
| 4,594,229 A | 6/1986 | Ciszek et al. | 422/246 |
| 4,627,887 A | 12/1986 | Sachs | 156/608 |
| 4,661,200 A | 4/1987 | Sachs | 156/616 |
| 4,689,109 A | 8/1987 | Sachs | 156/608 |
| 6,814,802 B2 | 11/2004 | Wallace, Jr. | 117/23 |
| 7,407,550 B2 | 8/2008 | Sachs | 117/200 |
| 2004/0083946 A1 | 5/2004 | Wallace, Jr. | |
| 2008/0134964 A1 | 6/2008 | Harvey et al. | 117/211 |

FOREIGN PATENT DOCUMENTS

| | | |
|---|---|---|
| GB | 2135595 A | 9/1984 |
| JP | 58194798 | 12/1983 |
| JP | 62113794 | 5/1987 |

OTHER PUBLICATIONS

T.F. Ciszek, et al., *Filament Materials for Edge-Supported Pulling of Silicon Sheet Crystals*, Solar Energy Research Institute, vol. 129, pp. 2838-2843, Dec. 1982.

J.L. Hurd, et al., *Semicontinuous Edge-Supported Pulling of Silicon Sheets*, Journal of Crystal Growth, vol. 59, pp. 499-506, Oct. 1982.

R.W. Miles, et al., *Photovoltaic solar cells: An Overview of state-of-the-art cell development and environmental issues*, Progress in Crystal Growth and Characterization of Materials, vol. 51, pp. 1-42, Jan. 2005.

R.L. Wallace, et al., *Thin Silicon String Ribbon for High-Efficiency Polycrystalline Solar Cells*, IEEE, vol. 26, pp. 99-102, Sep. 1997.

N.L. Chalfin, *Filament Guides for Silicon-Ribbon Growth*, NASA Tech Brief, vol. 9, from JPL Invention Report, 5 pages, Jun. 1985.

(Continued)

*Primary Examiner* — Catherine A Simone

(74) *Attorney, Agent, or Firm* — Ditthavong Mori & Steiner, P.C.

(57) ABSTRACT

A ribbon crystal has a body and end string within the body. At least one end string has a generally concave cross-sectional shape and is formed from at least two individual strings.

8 Claims, 8 Drawing Sheets

OTHER PUBLICATIONS

Authorized Officer Wolfgang Hoyer, *International Search Report and Written Opinion of the International Searching Authority*, International Searching Authority, International Application No. PCT/US2008/074715, Dec. 15, 2008, 12 pages.

Authorized Officer Wolfgang Hoyer, *International Search Report and Written Opinion of the International Searching Authority*, International Searching Authority, International Application No. PCT/US2008/074741, Dec. 10, 2008, 11 pages.

Authorized Officer Wolfgang Hoyer, *International Search Report and Written Opinion of the International Searching Authority*, International Searching Authority, International Application No. PCT/US2008/074731, Dec. 15, 2008, 10 pages.

Authorized Officer Maria Van Der Hoeven, *International Search Report and Written Opinion of the International Searching Authority*, International Searching Authority, International Application No. PCT/US2009/060730, Feb. 5, 2010, 12 pages.

RIBBON CRYSTAL END STRING WITH MULTIPLE INDIVIDUAL STRINGS

PRIORITY AND CROSS-REFERENCE TO RELATED APPLICATIONS

This patent application is a continuation-in-part of U.S. patent application Ser. No. 12/201,117, filed Aug. 29, 2008, entitled, "RIBBON CRYSTAL STRING FOR INCREASING WAFER YIELD," and naming Scott Reitsma as inventor, the disclosure of which is incorporated herein, in its entirety, by reference.

The parent patent application (U.S. Ser. No. 12/201,117) claims priority from provisional U.S. patent application Ser. No. 60/969,263, filed Aug. 31, 2007, entitled, "STRING RIBBON CRYSTAL AND STRING WITH IMPROVED EFFICIENCY," and naming Christine Richardson, Lawrence Felton, Richard Wallace, and Scott Reitsma as inventors, the disclosure of which is incorporated herein, in its entirety, by reference.

This patent application also is related to the following copending, co-owned patent applications, filed on Aug. 29, 2008, claiming the same priority to the U.S. provisional patent application No. 60/969,263, and incorporated herein, in their entireties, by reference:

Entitled, "REDUCED WETTING STRING FOR RIBBON CRYSTAL," and assigned U.S. patent application Ser. No. 12/200,996, and Entitled, "RIBBON CRYSTAL STRING WITH EXTRUDED REFRACTORY MATERIAL," and assigned U.S. patent application Ser. No. 12/201,180.

FIELD OF THE INVENTION

The invention generally relates to string ribbon crystals and, more particularly, the invention also relates to string used to form string ribbon crystals.

BACKGROUND OF THE INVENTION

String ribbon crystals, such as those discussed in U.S. Pat. No. 4,689,109 (issued in 1987 and naming Emanuel M. Sachs as the sole inventor), can form the basis of a variety of electronic devices. For example, Evergreen Solar, Inc. of Marlborough, Mass. forms solar cells from conventional string ribbon crystals.

As discussed in greater detail in the noted patent, conventional processes form string ribbon crystals by passing two or more strings through molten silicon. The composition and nature of the string can have a significant impact on the efficiency and, in some instances, the cost of the ultimately formed string ribbon crystal.

SUMMARY OF THE INVENTION

In accordance with one embodiment of the invention, a ribbon crystal has a body and end string within the body. At least one end string has a generally concave cross-sectional shape and is formed from at least two individual strings.

The noted two individual strings may be spaced apart generally along the thickness dimension of the body to generally form an elongated, concave cross-sectional shape. Moreover, body material (e.g., silicon) may be between the two individual strings. In alternative embodiments, the noted two individual strings are in physical contact.

In accordance with another embodiment of the invention, a ribbon crystal has a body and a plurality of end strings within the body. At least one end string is formed from at least a pair of spaced apart individual strings. Body material is positioned between the pair of individual strings.

At least one end string may have a generally concave cross-sectional shape. In addition, the individual strings each may generally form an elongated cross-sectional shape. Moreover, at least one of the individual strings may have a concavity that is generally symmetrical about the width dimension. The individual strings of the at least one end string may be spaced generally along the thickness dimension of the body.

In accordance with other embodiments of the invention, a method of forming a ribbon crystal provides a plurality of end strings. At least one of the end strings has at least two spaced apart individual strings. The method also adds molten material to a crucible, and then passes the end strings through the molten material to cause the molten material to freeze above an interface, thus forming a sheet of molten material. The at least one end string has frozen molten material between its individual strings above the interface.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative string ribbon fabrication processes use plural individual strings for each end of a ribbon crystal. For example, each end string may be formed from a pair of individual spaced apart strings. Geometric and thermal properties of such a string should improve crystal properties, such as by forming thicker neck regions. Details of various embodiments are discussed below.

Figure 1:
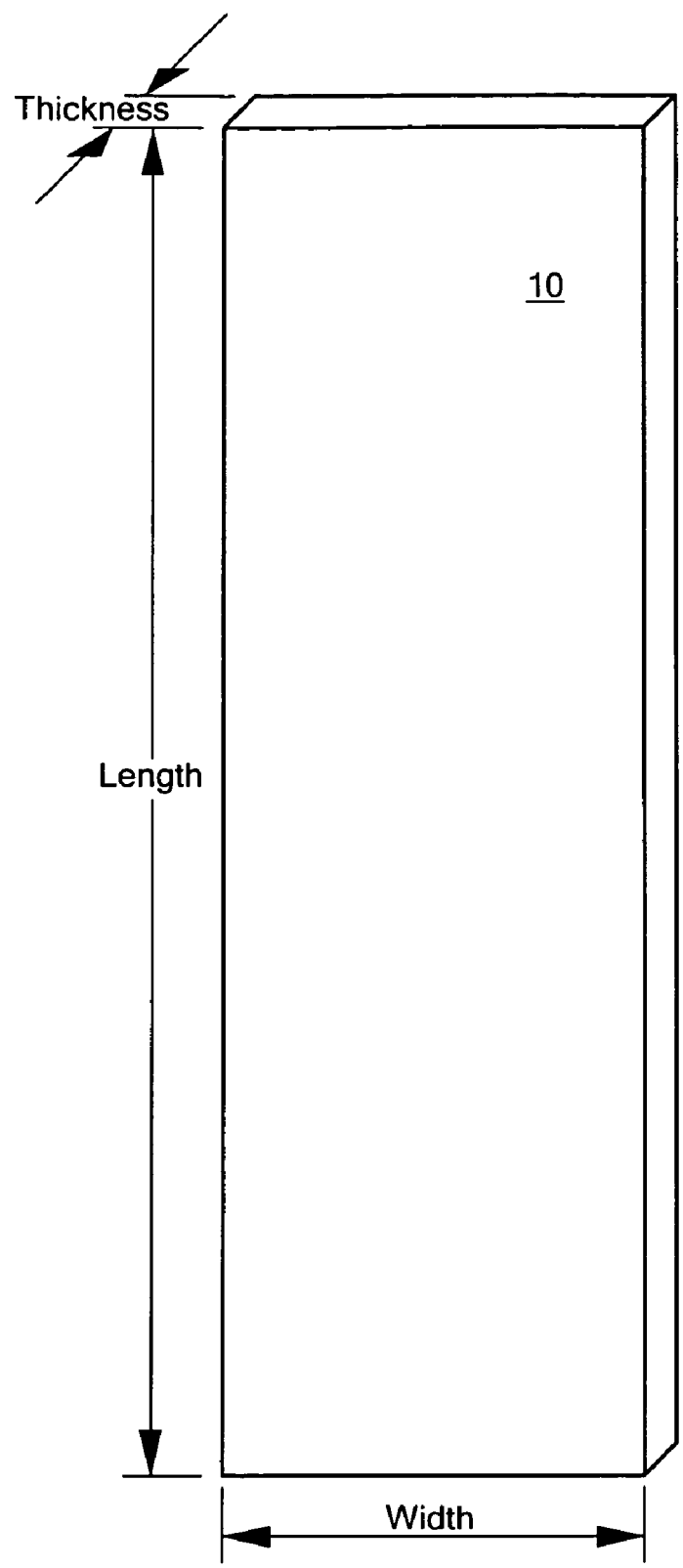
FIG. 1 schematically shows a string ribbon crystal that may be formed from strings configured in accordance with illustrative embodiments of the invention.

FIG. 1 schematically shows a string ribbon crystal 10 configured in accordance illustrative embodiments of the invention. In a manner similar to other ribbon crystals, this ribbon crystal 10 has a generally rectangular shape and a relatively large surface area on its front and back faces. For example, the ribbon crystal 10 may have a width of about 3 inches, and a length of about 6 inches. As known by those skilled in the art, the length can vary significantly. For example, in some known processes, the length depends upon a furnace operator's discretion as to where to cut the ribbon crystal 10 as it grows. In addition, the width can vary depending upon the separation of its two strings 12 (see FIG. 2) forming the ribbon crystal width boundaries. Accordingly, discussion of specific lengths and widths are illustrative and not intended to limit various embodiments the invention.

The thickness of the ribbon crystal 10 may vary and be very small relative to its length and width dimensions. For example, the string ribbon crystal 10 may have a thickness ranging from about 60 microns to about 320 microns across its width. Despite this varying thickness, the string ribbon crystal 10 may be considered to have an average thickness across its length and/or width.

The ribbon crystal 10 may be formed from any of a wide variety of materials (often referred to generally as "ribbon material" or "crystal material"), depending upon the application. For example, when grown for a photovoltaic application, the ribbon crystal 10 may be formed from a single element, such as silicon, or a compound, such as a silicon-based material (e.g., silicon germanium). Other illustrative ribbon materials may include gallium arsenide, or indium phosphide. The ribbon material may be any of a variety of crystal types, such as multi-crystalline, single crystalline, polycrystalline, microcrystalline or semi-crystalline.

As known by those skilled in the art, the ribbon crystal 10 is formed from a pair of strings 12 (see FIG. 2 and later figures) generally embedded/encapsulated by the ribbon material. As ascertained from the process discussed below, the pair of strings 12 effectively form the edges of the ribbon crystal 10; namely, they define the width of the ribbon crystal 10. Accordingly, the strings may be generally referred to herein as "end strings," or simply as strings 12. Moreover, for simplicity, the ribbon crystal 10 is discussed as being formed from polysilicon ribbon material. It nevertheless should be reiterated that discussion of polysilicon is not intended to limit all embodiments.

Figure 2:
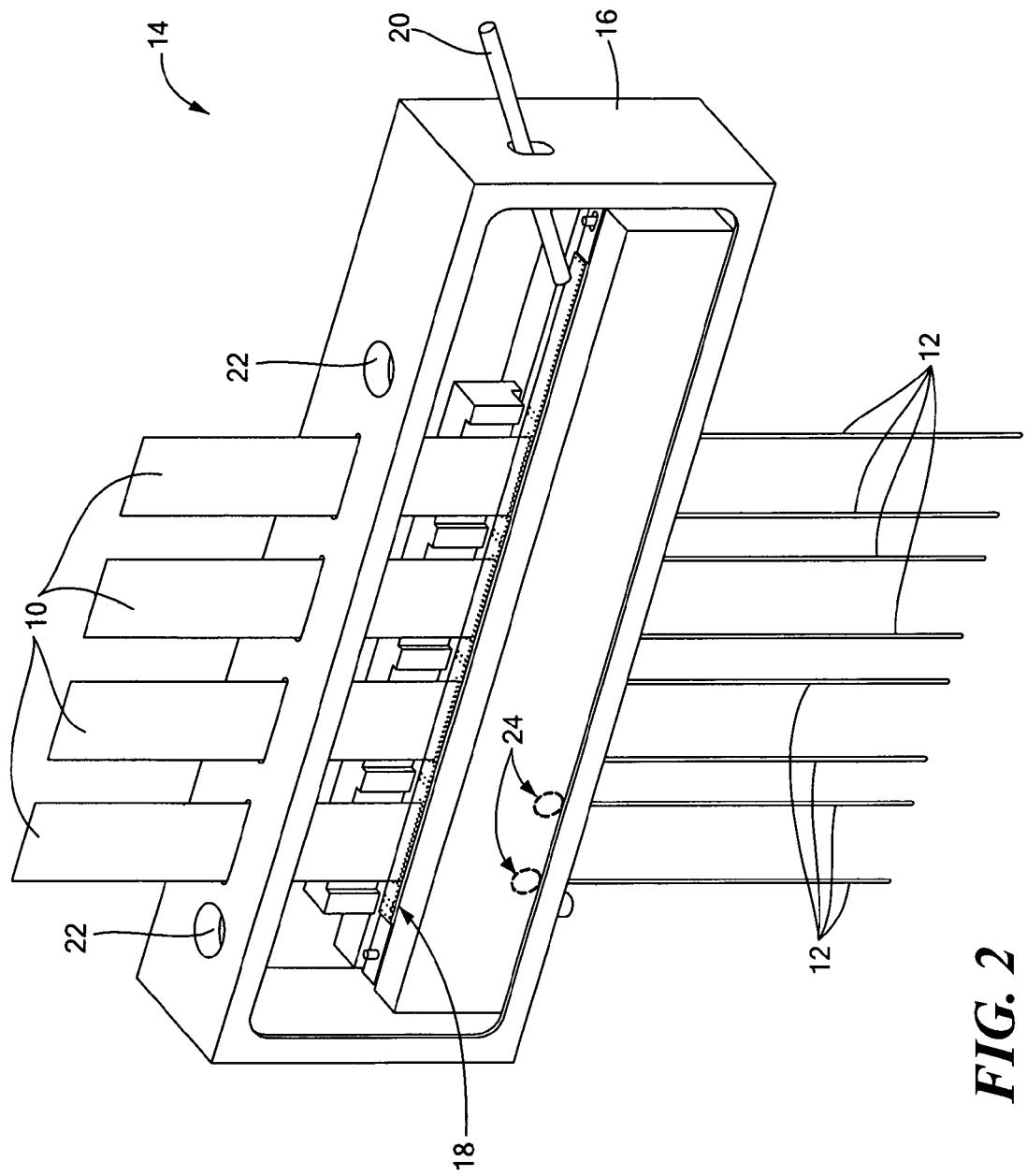
FIG. 2 schematically shows an illustrative furnace used to form string ribbon crystals.

Illustrative embodiments grow the ribbon crystal 10 in a ribbon crystal growth furnace 14, such as that shown in FIG. 2. More specifically, FIG. 2 schematically shows a silicon ribbon crystal growth furnace 14 that may be used to form the string ribbon crystal 10 in accordance with illustrative embodiments of the invention. The furnace 14 has, among other things, a housing 16 forming a sealed interior that is substantially free of oxygen (to prevent combustion). Instead of oxygen, the interior has some concentration of another gas, such as argon, or a combination of gasses. The housing interior also contains, among other things, a crucible 18 and other components for substantially simultaneously growing four silicon ribbon crystals 10. A feed inlet 20 in the housing 16 provides a means for directing silicon feedstock to the interior crucible 18, while an optional window 22 permits inspection of the interior components.

As shown, the crucible 18, which is supported on an interior platform within the housing 16, has a substantially flat top surface. This embodiment of the crucible 18 has an elongated shape with a region for growing silicon ribbon crystals 10 in a side-by-side arrangement along its length. In illustrative embodiments, the crucible 18 is formed from graphite and resistively heated to a temperature capable of maintaining silicon above its melting point. To improve results, the crucible 18 has a length that is much greater than its width. For example, the length of the crucible 18 may be three or more times greater than its width. Of course, in some embodiments, the crucible 18 is not elongated in this manner. For example, the crucible 18 may have a somewhat square shape, or a nonrectangular shape.

As shown in FIG. 2 and discussed in greater detail below, the furnace 14 has a plurality of holes 24 (shown in phantom) for receiving string 12 (i.e., the end strings 12). Specifically, the furnace 14 of FIG. 2 has eight string holes 24 for receiving four pairs of end strings 12. Each pair of strings 12 passes through molten silicon in the crucible 18 to form a single ribbon crystal 10.

Figure 3:
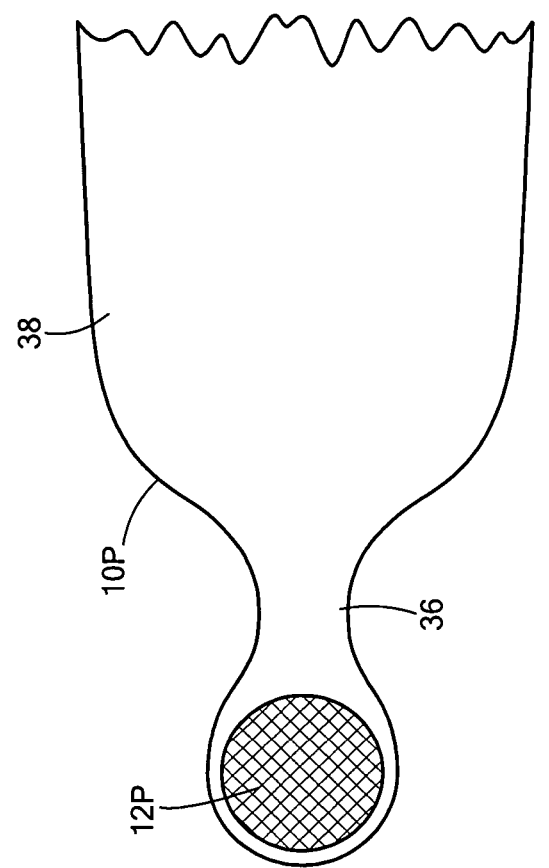
FIG. 3 schematically shows a cross-sectional view of a portion of a prior art ribbon crystal with a prior art string.

Many conventional ribbon crystal growth processes form ribbon crystals with a thin neck portion near the string. More specifically, FIG. 3 schematically shows a cross-sectional view of a portion of a prior art ribbon crystal 10P having a prior art string 12P. This prior art ribbon crystal 10P has a thin neck portion 36 between the string 12P and a wider portion 38 of the ribbon crystal 10. If the neck portion 36 is too thin, then the ribbon crystal 10P may be very fragile and more prone to breaking, thus leading to yield losses. For example, if the coefficient of thermal expansion differential between the string 12 and ribbon material forming the ribbon crystal 10P (e.g., polysilicon) is sufficiently large, the ribbon crystal 10P may be more prone to breaking at the neck portion 36.

To increase the neck thickness, those skilled in the art have added equipment to the ribbon growth process. For example, one such solution adds gas jets (not shown) to the furnace 14. These gas jets direct relatively cool gas streams toward the neck portion 36, thus decreasing the temperature in that area to increase neck thickness. Other solutions involve adding specialized meniscus shapers.

Rather than use such additional external measures, illustrative embodiments of the invention engineer the cross-sectional dimension of the string 12 in a prescribed manner. Illustrative embodiments then position the string 12 within the crystal growth furnace 14 in a manner that increases the size of the neck portion 36 of the growing ribbon crystal 10. For example, the resulting ribbon crystal 10 with an average thickness of about 190 microns may have a neck portion 36 with a minimum thickness of about 60 microns, which may suffice in certain applications. This innovation consequently should reduce yield loss, thus reducing production costs.

Figure 4A:
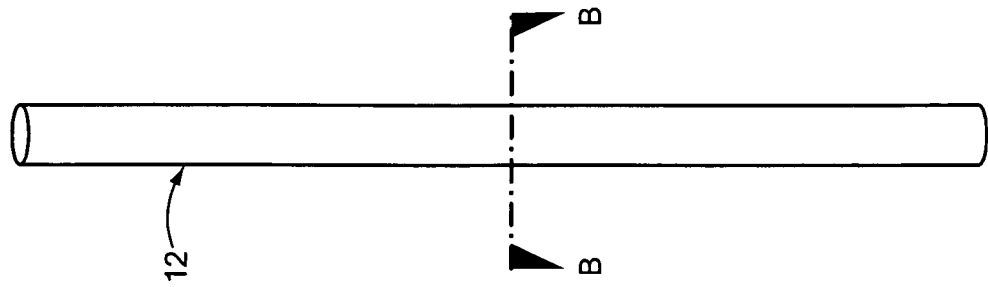
FIG. 4A schematically shows a string formed in accordance with illustrative embodiments of the invention.
Figure 4B:
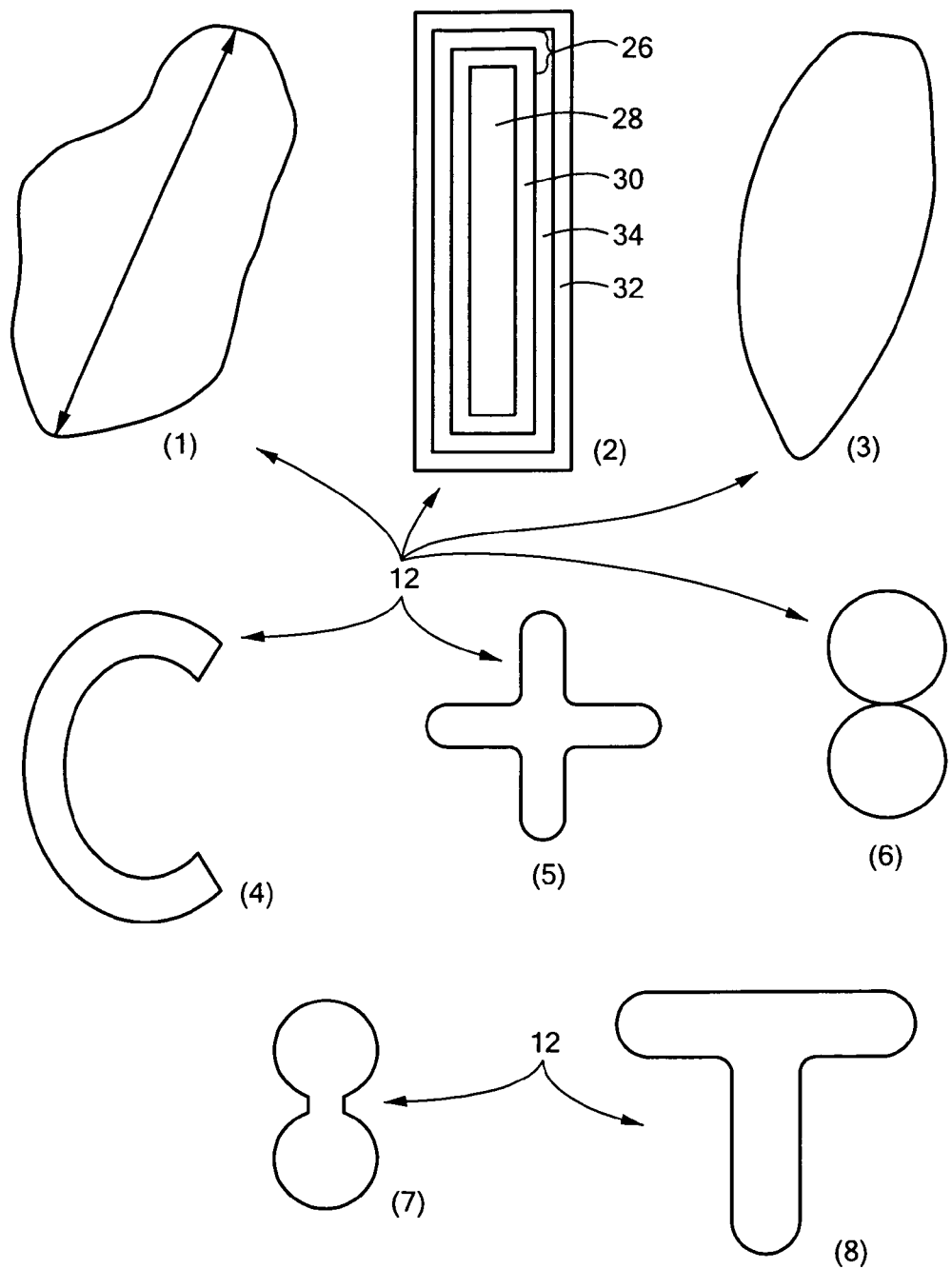
FIG. 4B schematically shows eight cross-sectional views of the string of FIG. 4A along line B-B in accordance with various embodiment of the invention.

FIG. 4A schematically shows a string 12 that may be formed in accordance with illustrative embodiments of the invention. Although this figure appears to show a generally convex or rounded cross-section, it should be considered merely schematic and not representative of any specific cross-sectional shape. To that end, FIG. 4B schematically shows eight different possible cross-sectional views of the string 12 of FIG. 4A along cross-line B-B in accordance with a number of different embodiments of the invention. For example, some of the shapes are generally elongated, such as the irregular shape of string one, the rectangular shape of string two, and the somewhat elliptical shape of string three.

Whether or not they are elongated, the various strings 12 may be categorized as being either generally concave or generally convex. As used herein, a cross-sectional shape is generally concave when any portion of its perimeter forms at least one non-negligible concavity. Thus, string one is considered to be generally concave despite its other convex portions. Conversely, a cross-sectional shape is considered to be generally convex when its perimeter forms no non-negligible concavities. Thus, string two and string three of FIG. 4B a generally convex.

FIG. 4B shows a number of other cross-sectional string shapes that are generally concave. In fact, some may be considered elongated and concave. For example, string four is generally "C" shaped, concave, and elongated, while string five is generally cross shaped, concave, but not elongated. The shape of string five (cross shaped) is not elongated because it is generally symmetrical—both the horizontal and vertical portions of the cross are about the same size. Depending upon its actual dimensions, string eight, which is generally "T" shaped, may or may not be considered elongated. For example, if the portion of the "T" shape extending downwardly is longer than its horizontal portion, then string eight may be considered elongated. In either case, string eight is considered to be generally concave.

During experimentation, as discussed below, the inventors were surprised to discover that forming the end strings 12 from plural individual strings significantly improved neck size. In other words, the end strings 12 may be formed from two or more individual strings. Strings six and seven show two such embodiments. Specifically, string six shows one embodiment where the individual strings 12 physically contact each other in the final ribbon crystal 10, while string seven shows another embodiment where the individual strings 12 are spaced from each other (in the final ribbon crystal 10). As inherently shown by string seven, the end string 12, using two spaced, individual strings comprises two individual stings, plus some ribbon body material (e.g., polysilicon) between the two individual strings.

It should be noted that end strings 12 using, plural individual strings may use more than two individual strings. For example, some end strings 12 may use three or four strings to increase their depth dimension. In addition, individual strings of these plural string embodiments may have the same or different cross-sectional shapes (e.g., a first elliptically shaped string 12 and another cross or circular shaped string 12).

It should be noted that the specific shapes of FIG. 4B merely are examples of a variety of different cross-sectional string shapes. Accordingly, those skilled in the art should understand that other string shapes fall within the scope of various embodiments.

Figure 5:
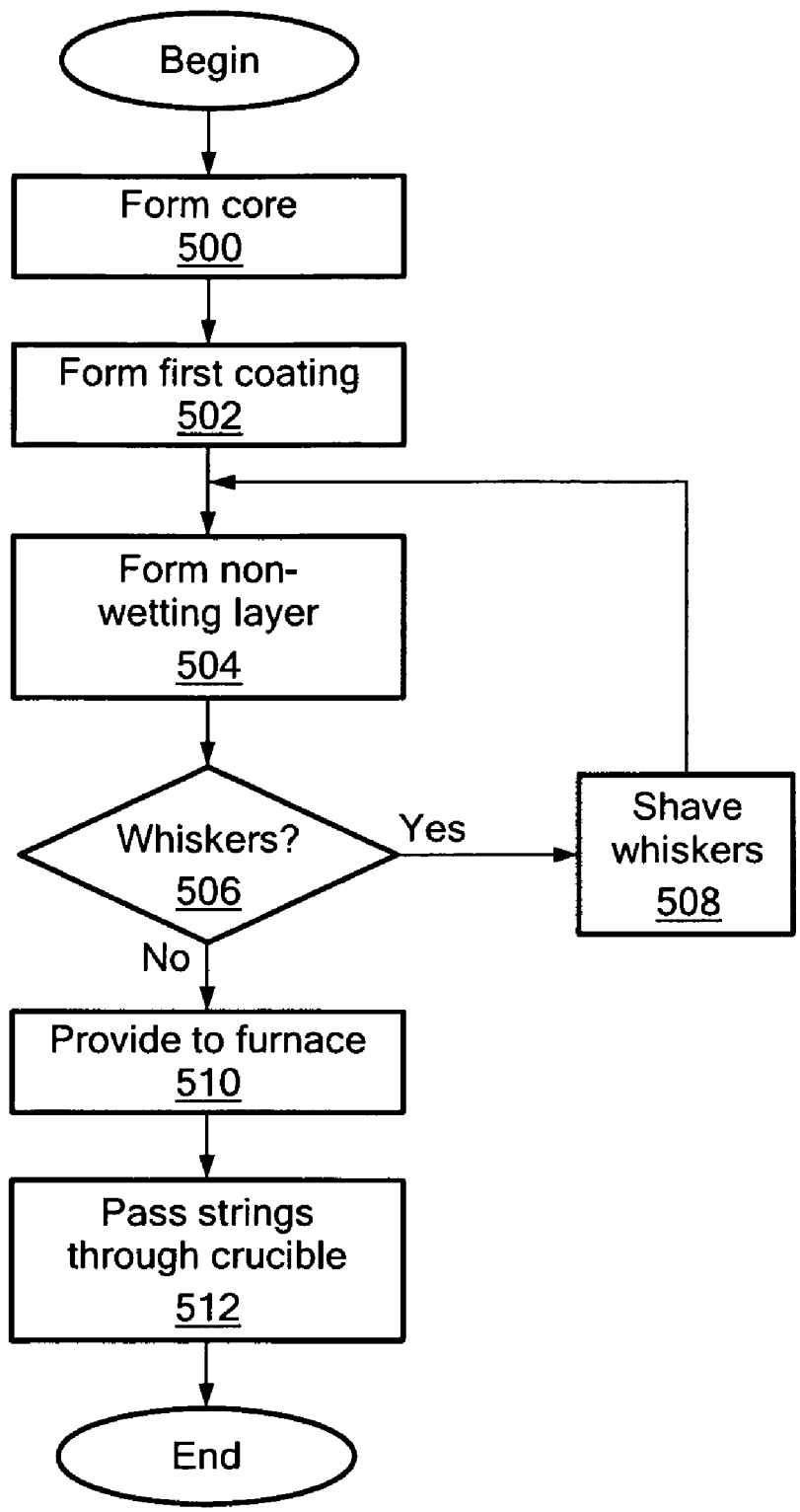
FIG. 5 shows an illustrative process of forming a string ribbon crystal using strings configured in accordance with illustrative embodiments of the invention.

FIG. 5 shows an illustrative process of forming a string ribbon crystal 10 with strings 12 configured in accordance with illustrative embodiments of the invention. For simplicity, this process is discussed with reference to string two of FIG. 4B only—because string two is the only string 12 in that figure explicitly showing various string layers discussed in this process. It nevertheless should be noted that the discussed principles apply to strings 12 having other cross-sectional shapes, or other strings formed by other processes.

The process begins at step 500 by forming a core/substrate 28, which acts as a substrate to receive a refractory material layer. As discussed in greater detail in co-pending U.S. patent application having and entitled, "REDUCED WETTING STRING FOR RIBBON CRYSTAL," (which is incorporated by reference above), the core 28 can be formed from carbon by conventional extruding processes. In other embodiments, however, the core 28 may be a wire, filament, or plurality of small conductive fibers wound together as a tow. For example, post-fabrication processes could form a monofilament through a known fabrication process, such as oxidation, carbonization, or infiltration.

The core 28 may have the desired cross-sectional shape. For example, as shown in FIG. 4B, the core 28 of string two is generally rectangular. Alternatively, the core 28 may have a different cross-sectional shape, while refractory material application equipment may be specially configured to form the desired cross-sectional shape. For example, the extrusion equipment may be specially configured to form the cross-sectional shape from a core material having a prespecified cross-sectional shape that is the same as or different than that of the final cross-sectional string shape.

After forming the core 28, the process forms a first coating/layer, which acts as the above noted refractory material layer 30 (step 502). Among other things, the first coating 30 may include silicon carbide, tungsten, or a combination of silicon carbide and tungsten. In addition, this first layer may be formed in a number of conventional ways, such as with a conventional (and often complex) CVD coating process.

To avoid the use of complex machinery and hazardous chemicals of a CVD process, illustrative embodiments extrude the refractory material directly onto the core/substrate 28. This may involve, among other things, a pulltrusion process, or both spinning of a refractory material with a polymer component, which subsequently is baked off. Processes may use at least one component of carbon, silicon, silicon carbide, silicon nitride, aluminum, mullite, silicon dioxide, BN particles, or fibers mixed with a polymer binder, coupled with extrusion/pulltrusion. This also may involve bicomponent extrusion of a core 28 with at least one silicon carbide, carbon, silicon, and a sheath with a least one of oxide, mullite, carbon, and/or silicon carbide. Accordingly, as noted above, the core 28 effectively acts as a substrate for supporting the refractory material layer 30.

This step thus forms what is considered to be a base string portion 26. It should be reiterated that the base string portion 26 may be formed from one or more of any of a wide variety of materials. Such materials may include a graphite fiber or tow, a refractory material, such as tungsten or silicon carbide, or a combination thereof. In fact, some embodiments may form the base string portion 26 without a core 28.

At this point in the process, the base string portion 26 has a combined coefficient of thermal expansion that preferably generally matches the coefficient of thermal expansion of the ribbon, material. Specifically, the thermal expansion characteristics of the string 12 should be sufficiently well matched to the ribbon material so that excessive stress does not develop at the interface. Stress is considered excessive if the string 12 exhibits a tendency to separate from the ribbon during reasonable subsequent ribbon crystal handling and processing steps, or if the string 12 exhibits a tendency to curl outwardly or inwardly from the ribbon crystal edge. In other embodiments, however, the coefficient of thermal expansion of the base string portion 26 does not generally match that of the ribbon material.

Some embodiments of the invention may have one or more additional layers, depending upon the application. For example, as discussed in greater detail in the above noted incorporated patent application having attorney docket number 3253/172, the string 12 may have a non-wetting/reduced wetting layer 32 to increase the grain size of the ribbon material. In that case, the process continues to step 504, which forms an exposed non-wetting/reduced layer 32 on the base string portion 26. In applications sensitive to coefficient of thermal expansion differences, this layer 32 preferably is very thin so that it has a negligible impact on the overall string coefficient of thermal expansion. For example, the reduced wetting layer 32 should be much thinner than that of the refractory material layer 30.

In embodiments using this non-wetting layer 32, the contact angle with the ribbon material of its exterior surface should be carefully controlled to cause the molten ribbon material to adhere to it—otherwise, the process cannot form the ribbon crystal 10. In applications using molten polysilicon, for example, it is anticipated that contact angles with silicon of between about 15 and 120° degrees should produce satisfactory results. Such angles of greater than 25 degrees may produce better results.

Among other ways, the non-wetting layer 32 may be formed by CVD processes, dip coating or other methods. For example, the base string portion 26 may be CVD coated by applying electrical contacts in a deposition chamber while it is being fed through the chamber—thus heating the base string portion 26 itself. Alternatively, the base string portion 26 may be heated by induction heating through the chamber. Related techniques for implementing this step include:

a sol gel dip for silica or alumina oxide or silicon oxycarbide either at the end of a CVD furnace or during rewind, a CVD nonwetting coating deposited by heating quartz from the outside and induction heating the base string portion 26, spray-on deposition, with a polymer binder that subsequently would be burned off, shaking particles onto a base string portion 26 or tow and then baking the into the base string portion 26 or tow, and coating with base string portion 26 with refractory slurry (e.g., silicon carbide/silicon dioxide) or liquid and then burning off residual.

The string 12 also may have a handling layer 34 radially outward of the refractory material layer 30 to maintain the integrity of the base string portion 26. To that end, if included, the handling layer 34 provides a small compressive stress to the base string portion 26, thus improving robustness to the overall string 12. Accordingly, if the base string portion 26 develops a crack, the compressive stress of the handling layer 34 should reduce the likelihood that the string 12 will break. Among other things, the handling layer 34 may be a thin layer of carbon (e.g., one or two microns thick for strings 12 having generally known sizes).

Accordingly, prior to performing step 504, some embodiments may form a handling layer 34 that is separate from the produced nonwetting layer 32 (e.g., see string two of FIG. 4B). Thus, in such an embodiment, the nonwetting wetting layer 32 substantially covers the handling layer 34. More specifically, the nonwetting layer 32 covers the outer, circumferential surface of the handling layer 34. Some embodiments, however, may integrate the non-wetting layer 32 into the handling layer 34.

It then is determined at step 506 if the coated string 12 has filaments extending through the nonwetting layer 32 (such filaments are referred to herein as "whiskers"). This can occur, for example, when a tow of filaments forms the core 28. If the coated string 12 has whiskers, then the process shaves them off at step 508. The process then may loop back to step 504, which re-applies the nonwetting, layer 32.

Alternatively, if the string 12 has no whiskers, the process continues to step 510, which provides the string 12 to the furnace 14 as shown in FIG. 2. To that end, some embodiments provide a single string 12 for each ribbon crystal edge, or multiple strings 12 for each ribbon crystal edge (e.g., strings six and seven of FIG. 6B). The term "string," unless explicitly modified to the contrary (e.g., by the words "single" or "multiple"), when mentioned with reference to forming a boundary/width of a ribbon crystal 10, generally means one or more strings.

Rather than using the methods above for forming the string 12, some embodiments machine or bore a concavity into a rounded or other otherwise generally convex string 12. Accordingly, the string 12 may be formed by other methods.

Figure 6A:
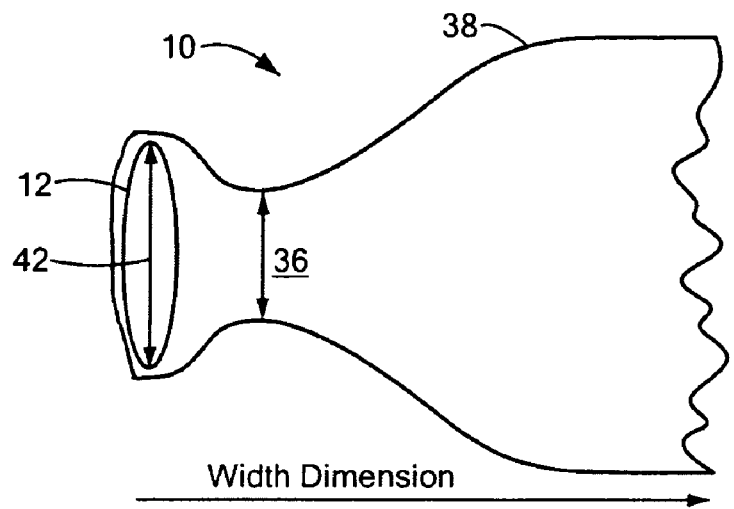
FIGS. 6A, 6B, and 6C schematically show cross-sectional views of ribbon crystals in accordance with an embodiment using strings with an elongated cross-section.
Figure 6B:
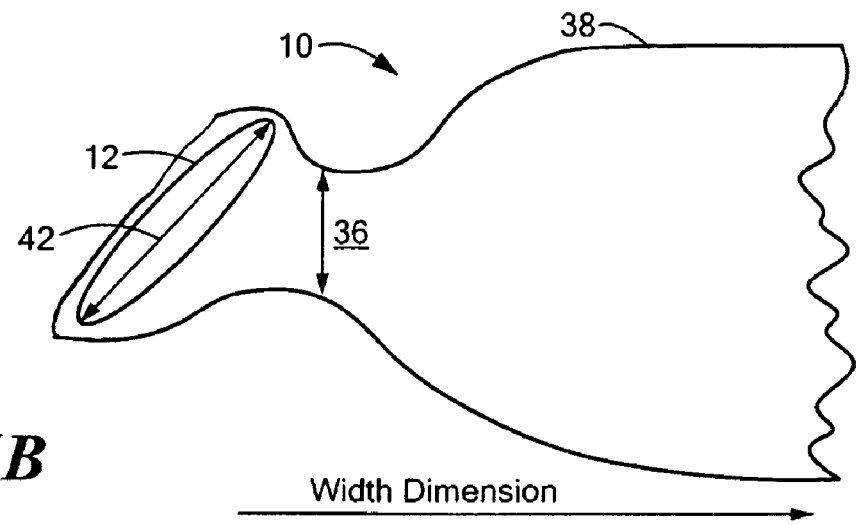
Figure 6C:
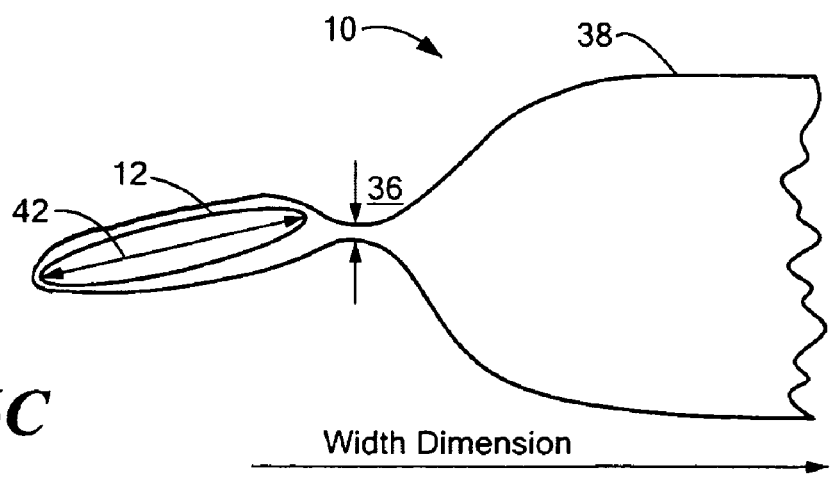

Illustrative embodiments orient the strings 12 in the furnace 14 in a manner that increases the thickness of the ribbon crystal neck portion 36. For example, FIGS. 6A-6C schematically show cross-sectional views of three ribbon crystals 10 with strings 12 having elongated, generally elliptical, generally convex cross-sectional shapes. To increase the thickness of the neck portion 36, these embodiments orient their respective generally longitudinal axes 42 so that they diverge with the width dimension of their respective ribbon crystals 10. In other words, to diverge, the longitudinal axis 42 is not parallel with the width dimension—instead, the longitudinal axis 42 and width dimension intersect.

More specifically, the cross-section of each string 12 has a largest dimension, each of which is shown as double-head arrows in FIGS. 6A-6C. For reference purposes, the longitudinal axis 42 of each of these elongated cross-sectional shapes thus is considered to be co-linear with the largest dimension. Prior art techniques known to the inventor orient this longitudinal axis 42 generally parallel with the width dimension of the ribbon crystal 10. Contrary to this explicit teaching in the art, however, the inventors discovered that orienting the longitudinal axis 42 so that it diverges with the ribbon crystal width dimension should increase the neck size.

For example, FIG. 6A orients the longitudinal axis 42 substantially perpendicular to the width dimension, while FIG. 6C orients the longitudinal axis 42 to form a shallow angle with the width dimension. FIG. 6B orients the longitudinal axis 42 between the extremes of FIGS. 6A and 6C. Either embodiment should increase the size of the neck portion 36 when compared to the above noted prior art technique. This neck size increase consequently should reduce breakage, thus improving yield.

It should be noted that orientations other than those shown in FIGS. 6A-6C also should provide satisfactory results. For example, orienting the longitudinal axis 42 in a manner so that is rotated about 90 degrees (either clockwise or counterclockwise) from the angle shown in FIG. 6B also should increase neck size.

As the strings 12 move through the furnace 14, the molten ribbon material (of each ribbon crystal 10) forms a meniscus. During testing, the inventor discovered that raising the height of the meniscus also generally increased the thickness of the neck portion 36. To that end, the inventors recognized that the principal radii of the cross-sectional string shapes should have certain prescribed properties.

More specifically, the pressure difference across the static interface between the gas and molten material is defined by the Young-Laplace Equation, which is set out as follows:

$$P_I - P_{II} = \sigma\left(\frac{1}{r_1} + \frac{1}{r_2}\right)$$

where:

$P_I$ is the pressure of molten material, $P_{II}$ is the pressure of the gas, r1 and r2 are principal radii of curvature of the meniscus, and σ (rho) is the surface tension.

The inventor determined that the meniscus height should increase if the pressure of the molten material is less than the pressure of the gas. To accomplish this, the inventors determined that the principal radii of curvature of the meniscus should be small when they are positive (i.e., when the cross-sectional shape is generally concave). Conversely, if the second radius of curvature r2 is negative, in which case the cross-sectional shape is generally convex, then the second radius of curvature r2 should be large.

Figure 7A:
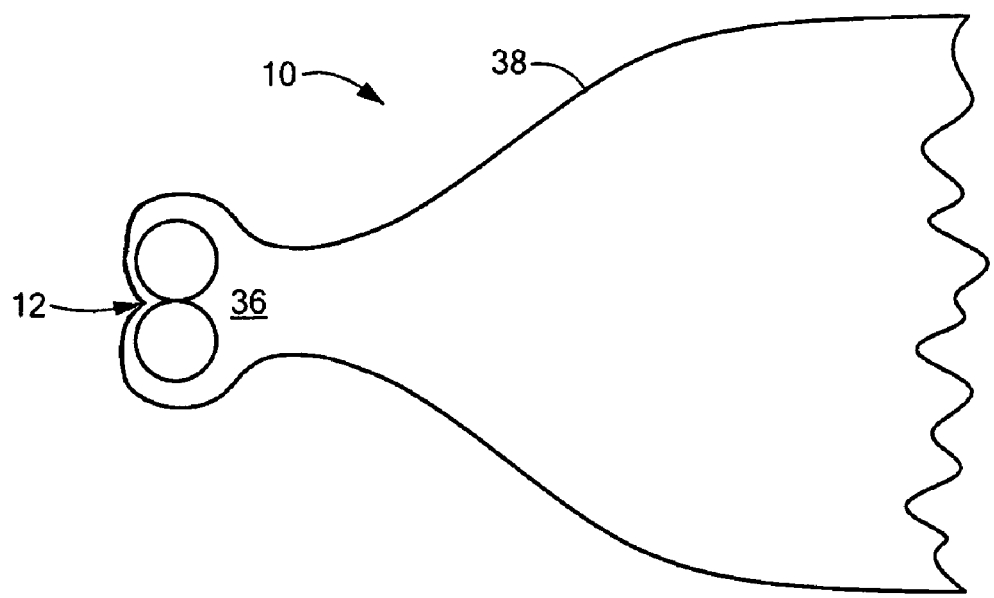
FIGS. 7A and 7B schematically show cross-sectional views of ribbon crystals with end string formed from multiple individual strings.
Figure 7B:
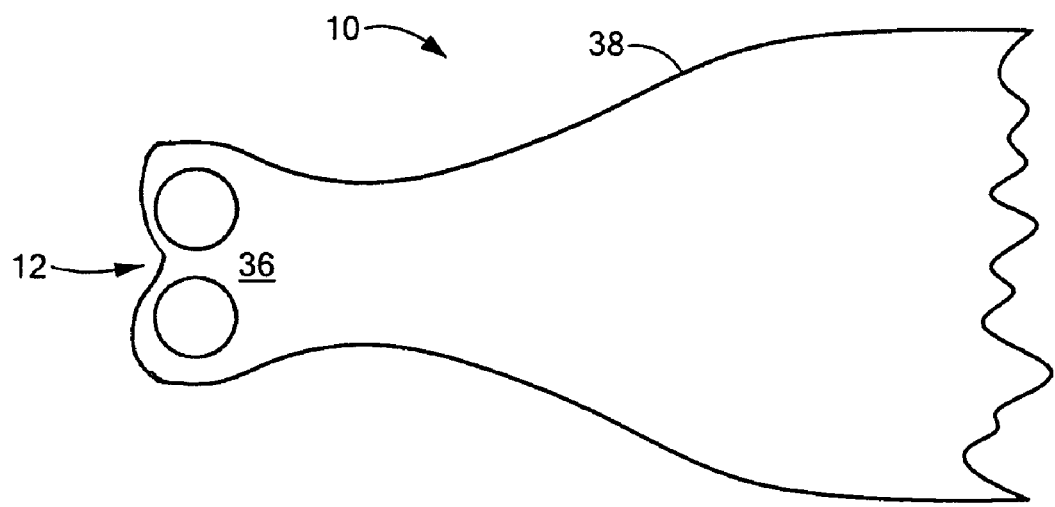

Early testing at least preliminarily confirms these conclusions. Moreover, such tests yielded additional, surprising results. Specifically, the inventor noticed the meniscus raising phenomenon by passing two individual strings 12 through the molten material for a single edge of a ribbon crystal 10. FIGS. 7A and 7B schematically show ribbon crystals 10 formed using this technique.

The inventor also noticed another surprising result when the individual strings 12 for each edge were separated (FIG. 7B). In particular, in one test, the two individual strings 12 forming a single edge were separated by about 700 microns. In addition to thickening the neck portion 36, a close examination of this edge also showed larger grains near in that region—a result that was completely unexpected (these individual strings 12 did not have the above noted nonwetting layer 32). As such, the inventor believes that such a technique, and related techniques, also should improve the electrical efficiency of the ribbon crystal 10.

Figure 8A:
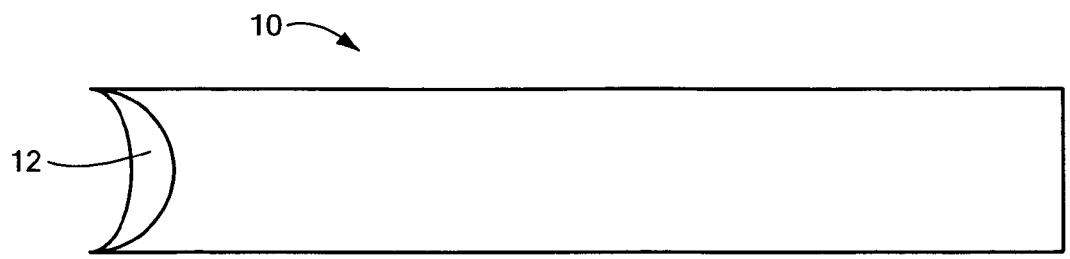
FIGS. 8A and 8B schematically show a ribbon crystal with a string having a generally concave cross-sectional shape.
Figure 8B:
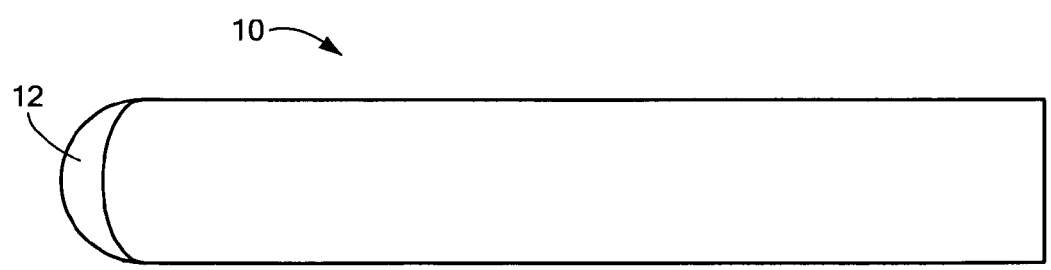

FIGS. 8A and 8B schematically show two ribbon crystals 10 with strings 12 having a generally concave cross-sectional shape. As shown, the strings 12 are oriented so that their concavities either are oriented completely toward or completely away from the wafer width (i.e., in the X-direction). In particular, the concavity is generally symmetrically oriented, e.g., the concavity forms a mirror image above and below the X-axis. This orientation is preferred because the inventor believes that it will shape the meniscus in a manner that promotes appropriate crystal growth. Significant rotation from these orientations (either clockwise or counterclockwise), however, may impact the meniscus shape to impede appropriate crystal growth. Those in the art can apply this concept to a string 12 having multiple concavities or concavities on opposing sides of the cross-sectional shape (e.g., a cross-shape).

At this point, for each ribbon crystal 10 being grown, the process passes two strings 12 (together forming the ultimate ribbon crystal width) through the furnace 14 and crucible 18, thus forming the string ribbon crystal 10 (step 512).

Accordingly, illustrative embodiments of the invention orient specially configured strings 12 within a ribbon crystal 10 to increase neck thickness. Alternatively, or in addition, specially configured strings 12 raise the height of the meniscus within the furnace 14 to further increase neck thickness. For example, end strings 12 formed from multiple individual strings may raise the meniscus portion between each individual string, in addition to the portion of the meniscus between the end strings 12. Ribbon crystals 10 grown using these techniques therefore should be less prone to breaking, thus improving yields.

Although the above discussion discloses various exemplary embodiments of the invention, it should be apparent that those skilled in the art can make various modifications that will achieve some of the advantages of the invention without departing from the true scope of the invention. For example, some embodiments may use more than two end strings 12 to form a single ribbon crystal 10.

What is claimed is:

1. A ribbon crystal comprising:
   a body having a thickness dimension; and
   end string within the body, at least one end string formed from at least two individual strings spaced apart generally along the thickness dimension of the body and generally forming an elongated, concave cross-sectional shape.

2. The ribbon crystal as defined by claim 1 further comprising body material between the at least two individual strings.

3. A ribbon crystal comprising:
   a body; and
   a plurality of end strings within the body, at least one end string comprising a pair of spaced apart individual strings; and
   body material between the pair of individual strings; wherein
   the at least one end string has a generally concave cross-sectional shape.

4. The ribbon crystal as defined by claim 3 wherein the body material comprises silicon.

5. The ribbon crystal as defined by claim 3 wherein the individual strings each generally form an elongated cross-sectional shape.

6. The ribbon crystal as defined by claim 3 wherein the body forms a width dimension, at least one of the individual strings having a concavity that is generally symmetrical about the width dimension.

7. The ribbon crystal as defined by claim 3 wherein at least two end strings each have a pair of spaced apart individual strings, body material being between the individual strings of the two end strings.

8. The ribbon crystal as defined by claim 3 wherein the body has a thickness dimension, the individual strings of the at least one end string being spaced generally along the thickness dimension of the body.

* * * * *